(12) United States Patent
Afghahi et al.

(10) Patent No.: US 6,574,136 B1
(45) Date of Patent: Jun. 3, 2003

(54) REDUCED LEAKAGE MEMORY CELL

(75) Inventors: Cyrus Afghahi, Mission Viejo, CA (US); Sami Issa, Phoenix, AZ (US); Zeynep Toros, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 09/989,595

(22) Filed: Nov. 20, 2001

(51) Int. Cl.[7] .............................................. G11C 11/401
(52) U.S. Cl. .......................... 365/149; 365/63; 365/72
(58) Field of Search ........................... 365/149, 185.05, 365/72, 63

(56) References Cited

U.S. PATENT DOCUMENTS

| | | | | | |
|---|---|---|---|---|---|
| 5,732,015 | A | * | 3/1998 | Kazerounian et al. | 365/154 |
| 5,793,246 | A | * | 8/1998 | Vest et al. | 307/110 |
| 5,949,710 | A | * | 9/1999 | Pass et al. | 365/185.05 |
| 6,159,795 | A | * | 12/2000 | Higashitani et al. | 438/257 |

* cited by examiner

*Primary Examiner*—Andrew Q. Tran
(74) *Attorney, Agent, or Firm*—McAndrews, Held & Malloy, Ltd.

(57) ABSTRACT

A random access memory cell (10) includes a first conductor line (12) and a second conductor line (14). A native device (16) is arranged to store charge. A high voltage threshold transistor (30) couples the native device to the first and second conductors.

13 Claims, 2 Drawing Sheets

REDUCED LEAKAGE MEMORY CELL

BACKGROUND OF THE INVENTION

This invention relates to memory cells and more particularly relates to memory cells of reduced leakage.

Dynamic random access memory (DRAM) implementation in deep sub-micron technology, such as <0.13 micron technology, is becoming very challenging due to excessive leakage. DRAM cells incorporate a charge storage device. The voltage created by the charge represents a digital one or a digital zero depending on the value of the voltage. However, the charge leaks and must be periodically refreshed to a proper value. As the size of the cells decreases, the charge leakage becomes excessive and requires more frequent refreshing. The increased frequency of the refreshing cycle decreases memory performance. This invention addresses the problem and provides a solution.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A random access memory cell made in accordance with one embodiment of the invention comprises a first conductor line, a second conductor line, a native device comprising a non-floating gate arranged to store charge and a transistor coupling the native device to the second conductor. A random access memory cell made in accordance with a second embodiment of the invention comprises a first conductor line; a second conductor line; and a native device arranged to store charge. The native device comprises a substrate body doped with n or p type material, and the substrate body defines a surface. A section of the substrate is doped with n or p type material adjacent the surface. A gate of the native device is adjacent the section, and a gating transistor couples the native device to the second conductor.

By using this memory cell, the amount of charge leakage can be reduced to a degree previously unattainable. These and other advantages and novel features of the present invention, as well as details of an illustrated embodiment thereof, will be more fully understood from the following description and drawings.

DETAILED DESCRIPTION OF THE INVENTION

Figure 1:
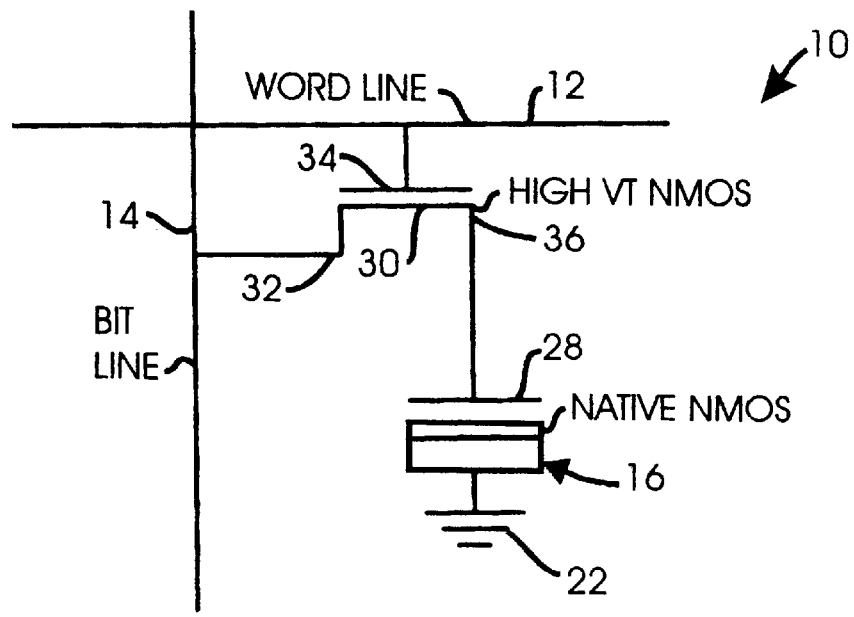
FIG. 1 is a schematic diagram of a first form of memory cell made in accordance with the invention, including a first form of native device arranged to store charge.

Referring to FIG. 1, one form of DRAM cell 10 made in accordance with the invention comprises a word line 12 and a bit line 14 arranged as shown. A native device 16 is used to store charge. In the FIG. 1 form of cell 10, native device 16 comprises an NMOS transistor of the type shown in FIG. 3.

Figure 3:
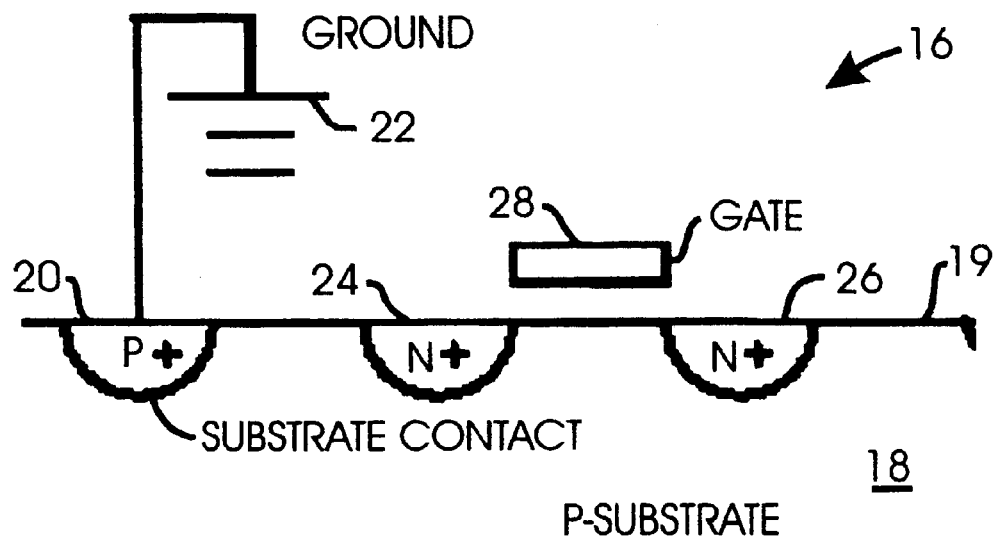
FIG. 3 is a schematic diagram of an exemplary form of the native device shown in FIG. 1.

Referring to FIG. 3, transistor 16 comprises a substrate body 18 doped with p type material defining a surface 19. Sections 20, 24 and 26 of the substrate are doped with different types of material. For example, section 20 is doped with p type material and sections 24 and 26 are doped with n type material. Each of sections 20, 24 and 26 is adjacent surface 19. Section 20 comprises a substrate contact that is connected to a source of reference potential 22, such as ground potential. A gate 28 is formed adjacent sections 24 and 26 as shown in a well known manner. Native devices have low threshold voltages by design, typically about 300 millivolts less than standard devices. As a result, charges stored on native devices increase due to the additional potential available for a given input voltage.

Referring to FIG. 1, cell 10 also comprises a gating transistor 30 including a source 32, a gate 34 and a drain 36 connected as shown. In particular, drain 36 is connected to gate 28 of native device 16, gate 34 is connected to line 12 and source 32 is connected to line 14.

In the form of cell shown in FIG. 1, transistor 30 comprises a high voltage threshold (VT) NMOS type transistor. A high voltage threshold transistor allows for increased drive current during periods of high cell activity, and reduced off-state leakage current when the cell is idle for a period of time. A high voltage threshold transistor leaks less than a low voltage threshold transistor. Transistor 36 typically responds to a gate threshold voltage in the range of 350 to 450 millivolts and has a drive current of about 150 microamps/micron.

By using transistor 16, a sense amplifier (not shown) used with cell 10 may be designed to reduce the electric field across the drain/source pass gate of cell 10. By reducing the electric field, subthreshold leakage is reduced. For example, a 100 millivolts of reduction in electric field decreases subthreshold leakage substantially.

Figure 2:
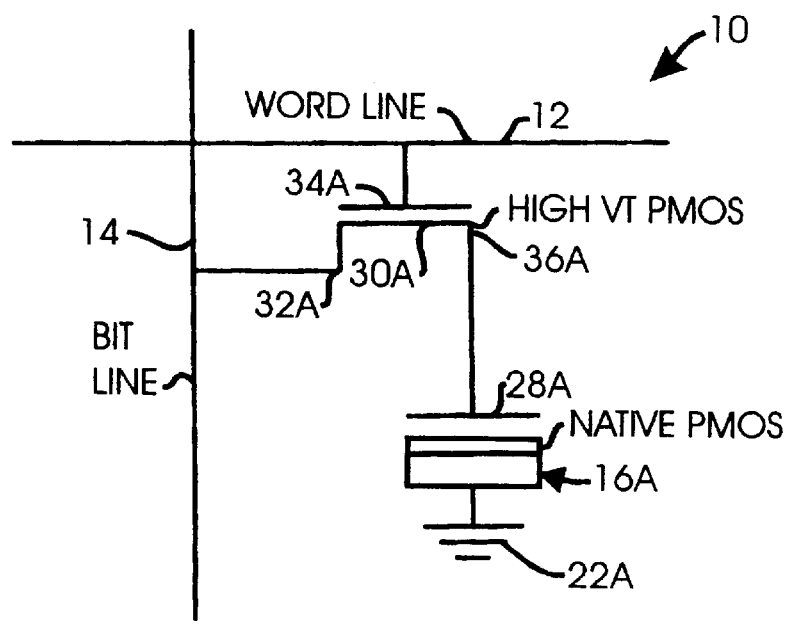
FIG. 2 is a schematic diagram of a second form of memory cell made in accordance with the invention, including a second form of native device arranged to store charge.

Referring to FIG. 2, a second form of DRAM cell 10 made in accordance with the invention comprises a word line 12 and a bit line 14 arranged as shown. A native device 16A is used to store charge. In the FIG. 2 form of cell 10, native device 16A comprises a PMOS transistor of the type shown in FIG. 4.

Figure 4:
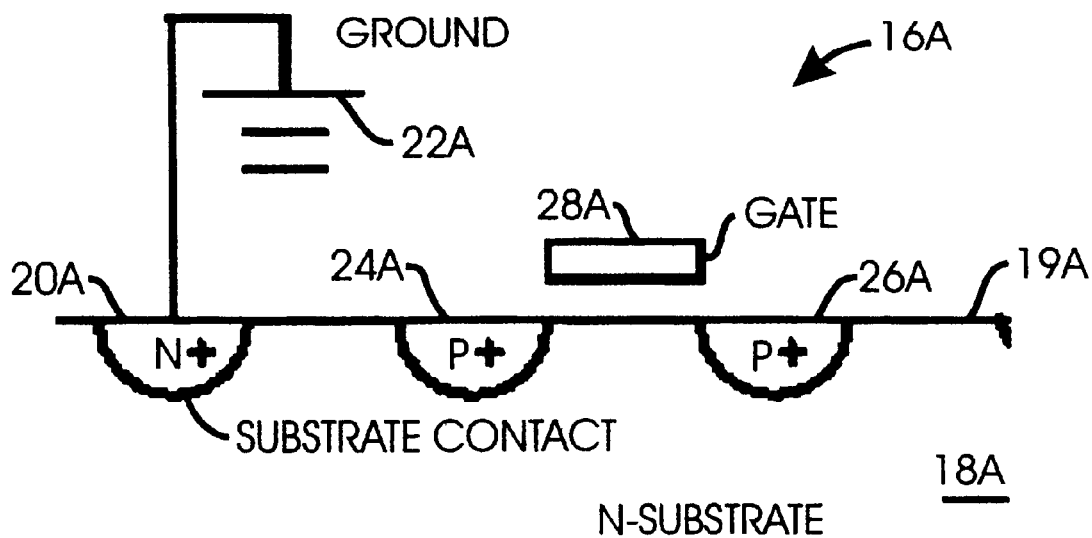
FIG. 4 is a schematic diagram of an exemplary form of the native device shown in FIG. 2.

Referring to FIG. 4, device 16A comprises a substrate body 18A doped with n type material defining a surface 19A. Sections 20A, 24A and 26A of the substrate are doped with different types of material. For example, section 20A is doped with n type material and sections 24A and 26A are doped with p type material. Each of sections 20A, 24A and 26A is adjacent surface 19A. Section 20A comprises a substrate contact that is connected to a source of reference potential 22A, such as ground potential. A gate 28A is formed adjacent sections 24A and 26A as shown in a well known manner.

Referring to FIG. 2, cell 10 also comprises a gating transistor 30A including a source 32A, a gate 34A and a drain 36A connected as shown. In particular, drain 36A is connected to gate 28A of native device 16A, gate 34A is connected to line 12 and source 32A is connected to line 14.

In the form of cell shown in FIG. 2, transistor 30A comprises a high voltage threshold (VT) PMOS type transistor. Transistor 36A typically responds to a gate threshold voltage in the range of 350 to 450 millivolts and has a drive current of about 110–120 microamps/micron.

By using transistor 16A, a sense amplifier (not shown) used with cell 10 may be designed to reduce the electric field across the drain/source pass gate of cell 10. By reducing the electric field, subthreshold leakage is reduced. For example, a 100 millivolts of reduction in electric field decreases subthreshold leakage substantially.

While the invention has been described with reference to one or more preferred embodiments, those skilled in the art will understand that changes may be made and equivalents may be substituted without departing from the scope of the invention. In addition, many modifications may be made to adapt a particular step, structure, or material to the teachings of the invention without departing from its scope. Therefore, it is intended that the invention not be limited to the particular embodiment disclosed, but that the invention will include all embodiments falling within the scope of the appended claims.

What is claimed is:

1. A random access memory cell comprising:
   a first conductor line;
   a second conductor line;
   a native device comprising a non-floating gate arranged to store charge; and
   a gating transistor coupling the native device to at least one of the first conductor and the second conductor.

2. The cell of claim 1 wherein the native device comprises a native transistor.

3. The cell of claim 1 wherein the native device comprises:
   a substrate body doped with a first type of material, said substrate body defining a surface;
   a section of the substrate doped with a second type of material adjacent the surface and adjacent the non-floating gate.

4. The cell of claim 3 wherein the gating transistor comprises:
   a transistor source;
   a transistor drain; and
   a transistor gate.

5. The cell of claim 4 wherein the non-floating gate is connected to the transistor drain.

6. The cell of claim 5 wherein the transistor gate is connected to the first conductor and the transistor source is connected to the second conductor.

7. The cell of claim 3 wherein the first type of material comprises p type material and the second type of material comprises n type material.

8. The cell of claim 3 wherein the first type of material comprises n type material and the second type of material comprises p type material.

9. The cell of claim 1 wherein the gating transistor comprises a high voltage threshold nmos transistor.

10. The cell of claim 1 wherein the gating transistor comprises a high voltage threshold pmos transistor.

11. The cell of claim 1 wherein the cell comprises a dynamic random access memory cell.

12. A random access memory cell comprising:
    a first conductor line;
    a second conductor line;
    a native device arranged to store charge, said native device comprising a substrate body doped with p type material, said substrate body defining a surface, a section of the substrate doped with n type material adjacent the surface, and a gate of the native device adjacent the section; and
    a gating transistor coupling the native device to at least one of the first conductor and the second conductor.

13. A random access memory cell comprising:
    a first conductor line;
    a second conductor line;
    a native device arranged to store charge, said native device comprising a substrate body doped with n type material, said substrate body defining a surface, a section of the substrate doped with p type material adjacent the surface, and a gate of the native device adjacent the section; and
    a gating transistor coupling the native device to at least one of the first conductor and the second conductor.

* * * * *